United States Patent
Zhang et al.

(10) Patent No.: US 11,442,319 B2
(45) Date of Patent: Sep. 13, 2022

(54) DISPLAY SUBSTRATE, DISPLAY APPARATUS, AND METHOD OF FABRICATING DISPLAY SUBSTRATE

(71) Applicant: BOE TECHNOLOGY GROUP CO., LTD., Beijing (CN)

(72) Inventors: Feng Zhang, Beijing (CN); Zhijun Lv, Beijing (CN); Wenqu Liu, Beijing (CN); Liwen Dong, Beijing (CN); Shizheng Zhang, Beijing (CN); Ning Dang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 763 days.

(21) Appl. No.: 16/071,691

(22) PCT Filed: Feb. 2, 2018

(86) PCT No.: PCT/CN2018/075081
§ 371 (c)(1),
(2) Date: Jul. 20, 2018

(87) PCT Pub. No.: WO2018/218987
PCT Pub. Date: Dec. 6, 2018

(65) Prior Publication Data
US 2021/0200011 A1    Jul. 1, 2021

(30) Foreign Application Priority Data

Jun. 2, 2017 (CN) .......................... 201710417593.5

(51) Int. Cl.
*G02F 1/1343* (2006.01)
*G02F 1/1333* (2006.01)
(Continued)

(52) U.S. Cl.
CPC ...... *G02F 1/13439* (2013.01); *G02F 1/13394* (2013.01); *G02F 1/133345* (2013.01);
(Continued)

(58) Field of Classification Search
CPC ........... G02F 1/13439; G02F 1/133345; G02F 1/134363
See application file for complete search history.

(56) References Cited

U.S. PATENT DOCUMENTS

2006/0227275 A1* 10/2006 Lee .................. G02F 1/134363
349/141
2009/0284707 A1* 11/2009 Cho .................. G02F 1/134363
349/160

(Continued)

FOREIGN PATENT DOCUMENTS

CN  205881903 U  1/2017
JP  2011191434 A  9/2011

(Continued)

OTHER PUBLICATIONS

Extended European Search Report in the European Patent Application No. 18755117.1, dated Dec. 10, 2019.

(Continued)

*Primary Examiner* — Mariam Qureshi
(74) *Attorney, Agent, or Firm* — Intellectual Valley Law, P.C.

(57) ABSTRACT

The present application discloses display substrate having a base substrate; an insulating layer on the base substrate; and an electrode layer on a side of the insulating layer distal to the base substrate and having a plurality of electrode blocks. The insulating layer has a first side distal to the base substrate and a second side opposite to the first side and proximal to the base substrate. Each of the plurality of electrode blocks has a third side distal to the base substrate (Continued)

and a fourth side opposite to the third side and proximal to the base substrate. The first side of the insulating layer in the inter-electrode block region has a first height relative to a surface of the base substrate greater than a second height of the fourth side of an adjacent electrode of the plurality of electrode blocks relative to the surface of the base substrate.

20 Claims, 11 Drawing Sheets

(51) Int. Cl.
    *G02F 1/1339*     (2006.01)
    *H01L 27/32*     (2006.01)
    *H01L 51/56*     (2006.01)

(52) U.S. Cl.
    CPC .... *G02F 1/134309* (2013.01); *H01L 27/3218* (2013.01); *H01L 27/3246* (2013.01); *H01L 51/56* (2013.01)

(56) References Cited

U.S. PATENT DOCUMENTS

| | | |
|---|---|---|
| 2010/0255746 A1 | 10/2010 | Hanaoka et al. |
| 2011/0090006 A1 | 4/2011 | Yamazaki et al. |
| 2014/0027735 A1* | 1/2014 | Kim .................. H01L 51/56 257/40 |
| 2017/0139526 A1 | 5/2017 | Akimoto |
| 2017/0141169 A1 | 5/2017 | Sim et al. |
| 2017/0141172 A1* | 5/2017 | Cho ................ H01L 27/3246 |

FOREIGN PATENT DOCUMENTS

| | | |
|---|---|---|
| JP | 2014149532 A | 8/2014 |
| JP | 2017097400 A | 6/2017 |

OTHER PUBLICATIONS

Second Office Action in the Chinese Patent Application No. 201710417593.5, dated Oct. 26, 2020; English translation attached.
First Office Action in the Indian Patent Application No. 201837031735, dated Nov. 17, 2020.
Reconsideration Report by Examiner before Appeal in the Japanese Patent Application No. 2018545193, dated Jun. 27, 2022; English translation provided.

* cited by examiner

DISPLAY SUBSTRATE, DISPLAY APPARATUS, AND METHOD OF FABRICATING DISPLAY SUBSTRATE

CROSS-REFERENCE TO RELATED APPLICATION

This application is a national stage application under 35 U.S.C. § 371 of International Application No. PCT/CN2018/075081, filed Feb. 02, 2018, which claims priority to Chinese Patent Application No. 201710417593.5, filed Jun. 2, 2017, the contents of which are incorporated by reference in the entirety.

TECHNICAL FIELD

The present invention relates to display technology, more particularly, to a display substrate, a display apparatus having the same, and a fabricating method thereof.

BACKGROUND

Display apparatuses such as liquid crystal display (LCD) apparatuses, organic light-emitting diode display (OLED) apparatuses, and electrophoretic display (EPD) apparatuses have been widely used. Typically, the display apparatus includes an army substrate and a counter substrate assembled together. An array substrate typically includes a plurality of subpixel areas in its display area, each of the plurality of subpixel areas is controlled by a thin film transistor for image display.

SUMMARY

In one aspect, the present invention provides a display substrate comprising a base substrate; an insulating layer on the base substrate; and an electrode layer on a side of the insulating layer distal to the base substrate and comprising a plurality of electrode blocks; wherein the display substrate has an electrode block region corresponding to the plurality of electrode blocks, and an inter-electrode block region outside the electrode block region; the insulating layer has a first side distal to the base substrate and a second side opposite to the first side and proximal to the base substrate; each of the plurality of electrode blocks has a third side distal to the base substrate and a fourth side opposite to the third side and proximal to the base substrate; and the first side of the insulating layer in the inter-electrode block region has a first height relative to a surface of the base substrate greater than a second height of the fourth side of an adjacent electrode of the plurality of electrode blocks relative to the surface of the base substrate.

Optionally, the first side of the insulating layer in the electrode block region has a third height relative to the surface of the base substrate smaller than or substantially same as the second height of the fourth side of the adjacent electrode of the plurality of electrode blocks relative to the surface of the base substrate.

Optionally, the insulating layer comprises a protrusion in the inter-electrode block region and a recess in the electrode block region; and orthographic projections of the plurality of electrode blocks on the base substrate are substantially non-overlapping with an orthographic projection of the protrusion.

Optionally, the first side of the insulating layer in the electrode block region is in direct contact with the fourth side of the adjacent electrode of the plurality of electrode blocks.

Optionally, the first height is greater than the second height by approximately 1 μm to approximately 3 μm.

Optionally, the first height is greater than the third height by approximately 1 μm to approximately 3 μm.

Optionally, the display substrate has a plurality of subpixel regions; each of the plurality of electrode blocks is in one of the plurality of subpixel regions; and the inter-electrode block region is an inter-subpixel region.

Optionally, the display substrate is a light emitting diode display substrate comprising a plurality of light emitting diodes; the plurality of electrode blocks are a plurality of anodes for driving light emission in the plurality of light emitting diodes; and the insulating layer is a planarization layer.

Optionally, the display substrate further comprises a pixel definition layer on a side of the planarization layer distal to the base substrate.

Optionally, the display substrate further comprises a spacer layer on a side of the pixel definition layer distal to the planarization layer.

Optionally, the display substrate is a liquid crystal display substrate; the plurality of electrode blocks are a plurality of pixel electrodes for driving light emission in a plurality of subpixel regions; and the insulating layer is a passivation layer.

Optionally, the display substrate is a liquid crystal display substrate, and the plurality of electrode blocks are a plurality of common electrodes.

Optionally, the insulating layer in the inter-electrode block region and the electrode block region is an integral insulating layer extending substantially throughout the display substrate.

Optionally, the first height of the first side of the insulating layer in the inter-electrode block region relative to a surface of the base substrate is greater than a fourth height of the third side of the adjacent electrode of the plurality of electrode blocks relative to the surface of the base substrate.

Optionally, the insulating layer in the inter-electrode block region and the electrode block region is an integral insulating layer extending substantially throughout the display substrate; the first height of the first side of the insulating layer in the inter-electrode block region relative to a surface of the base substrate is greater than a fourth height of the third side of the adjacent electrode of the plurality of electrode blocks relative to the surface of the base substrate; and the first side of the insulating layer in the electrode block region has a third height relative to the surface of the base substrate smaller than or substantially same as the second height of the fourth side of the adjacent electrode of the plurality of electrode blocks relative to the surface of the base substrate.

In another aspect, the present invention provides a display apparatus, comprising the display substrate described herein or fabricated by a method described herein.

In another aspect, the present invention provides a method of fabricating a display substrate, comprising forming an insulating layer on a base substrate; and subsequent to forming the insulating layer, forming an electrode layer on a side of the insulating layer distal to the base substrate, the electrode layer formed to comprises a plurality of electrode blocks; wherein the display substrate is formed to have an electrode block region corresponding to the plurality of electrode blocks, and an inter-electrode block region outside the electrode block region; the insulating layer is formed to have a first side distal to the base substrate and a second side opposite to the first side and proximal to the base substrate; each of the plurality of electrode blocks is formed to have a third side distal to the base substrate and a fourth side opposite to the third side and proximal to the base substrate; and the insulating layer and the electrode layer are formed so that the first side of the insulating layer in the inter-electrode block region has a first height relative to a surface of the base substrate greater than a second height of the fourth side of an adjacent electrode of the plurality of electrode blocks relative to the surface of the base substrate.

Optionally, the insulating layer and the electrode layer are formed so that the first side of the insulating layer in the electrode block region has a third height relative to the surface of the base substrate smaller than or substantially same as the second height of the fourth side of the adjacent electrode of the plurality of electrode blocks relative to the surface of the base substrate.

Optionally, the insulating layer is formed so that an orthographic projection of the insulating layer on the base substrate is substantially non-overlapping with orthographic projections of the plurality of electrode blocks on the base substrate.

Optionally, forming the insulating layer comprises forming an insulating material layer on the base substrate; and patterning the insulating material layer using a half-tone mask plate or a gray-tone mask plate thereby forming the insulating layer and a plurality of vias extending through the insulating layer, wherein the insulating layer is formed to have a first part in the inter-electrode block region and a second part in the electrode block region.

Optionally, the display substrate is a light emitting diode display substrate comprising a plurality of light emitting diodes; the plurality of electrode blocks are a plurality of anodes for driving light emission in the plurality of light emitting diodes; and the insulating layer is a planarization layer; the method further comprising forming a pixel definition layer on a side of the planarization layer distal to the base substrate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1:
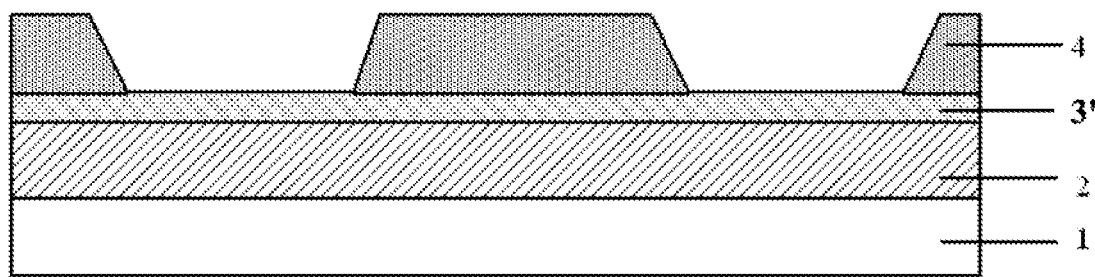
FIG. 1 illustrates a conventional display substrate having residues of an anode material remain in an etched area.
Figure 1:
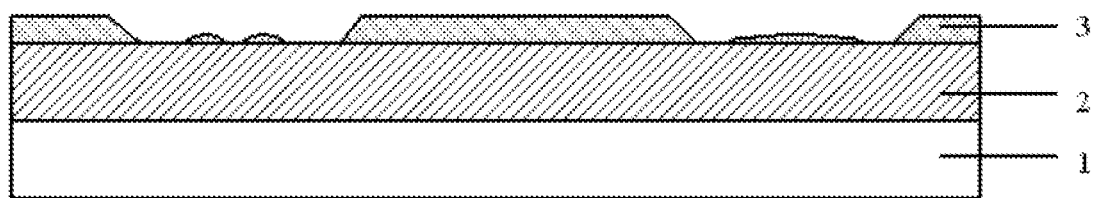

In conventional display substrates, defects frequently occur due to under-etching of conductive material layer. Particularly, when etching a portion of the conductive material layer enclosed in a narrow or small area using a wet etchant, permeation of the etchant solution into the narrow or small area is often insufficient, resulting in residues of the conductive material remain after the etching process. FIG. 1 illustrates a conventional display substrate having residues of an anode material remain in an etched area. Referring to FIG. 1, a planarization layer 2 having a substantially uniform thickness is formed on a base substrate 1, an anode material layer 3' (e.g., an indium tin oxide/silver/indium tin oxide material layer) is formed on the planarization layer 2, and a photoresist layer 4 is formed on the anode material layer 3'. The photoresist layer 4 has a pattern exposing certain areas of the anode material layer 3'. The exposed areas of the anode material layer 3' is then etched to form an anode layer 3. Due to the insufficient permeation of the etchant solution and under-etching of the anode material discussed above, residues of the anode material remain in the display substrate after the etching process, leading to defects in the display substrate.

Accordingly, the present disclosure provides, inter alia, a display substrate, a display apparatus having the same, and a fabricating method thereof that substantially obviate one or more of the problems due to limitations and disadvantages of the related art. In one aspect, the present disclosure provides a display substrate. In some embodiments, the display substrate includes a base substrate; an insulating layer on the base substrate; and an electrode layer on a side of the insulating layer distal to the base substrate and including a plurality of electrode blocks. The display substrate has an electrode block region corresponding to the plurality of electrode blocks, and an inter-electrode block region outside the electrode block region. The insulating layer has a first side distal to the base substrate and a second side opposite to the first side and proximal to the base substrate. Each of the plurality of electrode blocks has a third side distal to the base substrate and a fourth side opposite to the third side and proximal to the base substrate. Optionally, the first side of the insulating layer in the inter-electrode block region has a first height relative to a surface of the base substrate greater than a second height of the fourth side of an adjacent electrode of the plurality of electrode blocks relative to the surface of the base substrate. Optionally, the insulating layer is a layer immediately adjacent to the electrode layer. Optionally, the display substrate includes additional layers between the electrode layer and the insulating layer.

Figure 2:
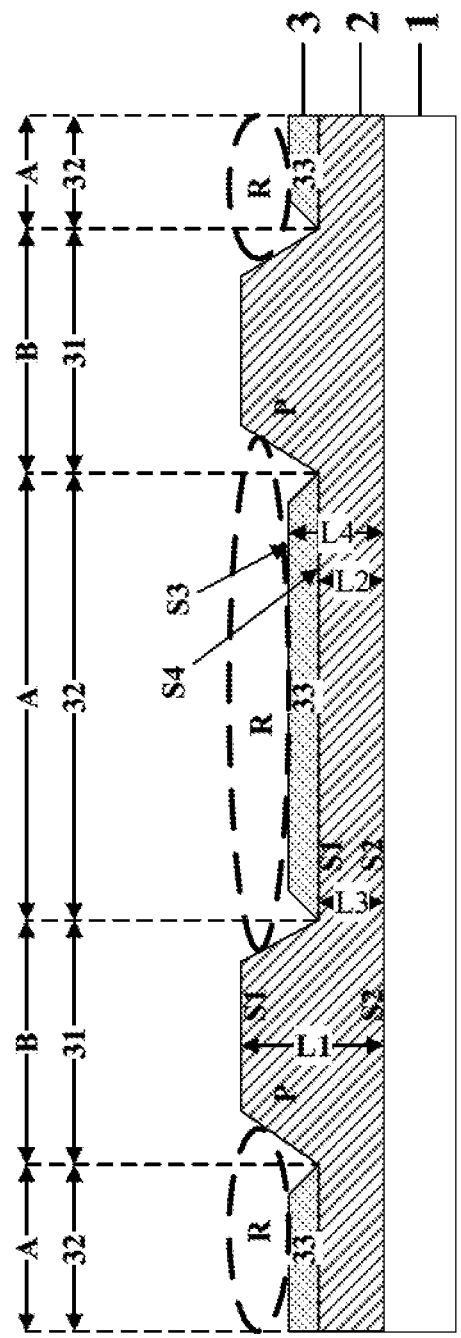
FIG. 2 is a schematic diagram illustrating the structure of a display substrate in some embodiments according to the present disclosure.

FIG. 2 is a schematic diagram illustrating the structure of a display substrate in some embodiments according to the present disclosure. Referring to FIG. 2, the display substrate in some embodiments includes a base substrate 1; an insulating layer 2 on the base substrate; and an electrode layer 3 on a side of the insulating layer 2 distal to the base substrate 1. The electrode layer 3 includes a plurality of electrode blocks 33. The display substrate has an electrode block region 32 corresponding to the plurality of electrode blocks 33, and an inter-electrode block region 31 outside the electrode block region 32. In some embodiments, the insulating layer 2 has a non-uniform thickness, e.g., thicker in some regions (e.g., in the inter-electrode block region 31) and thinner in some other regions (e.g., in the electrode block region 32). The insulating layer 2 has a first side S1 distal to the base substrate 1 and a second side S2 opposite to the first side S1 and proximal to the base substrate 1. Each of the plurality of electrode blocks 33 has a third side S3 distal to the base substrate 1 and a fourth side S4 opposite to the third side S3 and proximal to the base substrate 1. As shown in FIG. 2, in the inter-electrode block region 31, the first side S1 of the insulating layer 2 has a first height L1 relative to a surface of the base substrate 1 greater than a second height L2 of the fourth side S4 of an adjacent electrode of the plurality of electrode blocks 33 relative to the surface of the base substrate 1. In the electrode block region 32, the first side S1 of the insulating layer 2 has a third height L3 relative to the surface of the base substrate 1 smaller than or substantially the same as the second height L2 of the fourth side S4 of the adjacent electrode of the plurality of electrode blocks 33 relative to the surface of the base substrate 1. Optionally, the first side S1 of the insulating layer 2 in the electrode block region 32 is in direct contact with the fourth side S4 of the adjacent electrode of the plurality of electrode blocks 33, e.g., the first side S1 of the insulating layer 2 in the electrode block region 32 is connected with the fourth side S4 of the adjacent electrode of the plurality of electrode blocks 33 with any intermediate structure.

Referring to FIG. 2, the insulating layer 2 includes a protrusion P in the inter-electrode block region 31 and a recess R in the electrode block region 32. Optionally, orthographic projections of the plurality of electrode blocks 33 on the base substrate 1 are substantially non-overlapping with an orthographic projection of the protrusion P on the base substrate 1. Optionally, orthographic projections of the plurality of electrode blocks 33 on the base substrate 1 are substantially overlapping with an orthographic projection of the recess R on the base substrate 1. Optionally, the orthographic projection of the recess R on the base substrate 1 substantially covers the orthographic projections of the plurality of electrode blocks 33 on the base substrate 1. Optionally, the plurality of electrode blocks 33 are substantially limited to the recess R, and the display substrate is substantially free of the plurality of electrode blocks 33 on the protrusion P.

Optionally, the first height L1 is greater than the second height L2 by approximately 1 μm to approximately 3 μm, e.g., by approximately 1.0 μm to approximately 1.5 μm, by approximately 1.5 μm to approximately 2.0 μm, by approximately 2.0 μm to approximately 2.5 μm, and by approximately 2.5 μm to approximately 3.0 μm.

Optionally, the first height L1 is greater than the third height L3 by approximately 1 μm to approximately 3 μm, e.g., by approximately 1.0 μm to approximately 1.5 μm, by approximately 1.5 μm to approximately 2.0 μm, by approximately 2.0 μm to approximately 2.5 μm, and by approximately 2.5 μm to approximately 3.0 μm.

Optionally, the first height L1 of the first side S1 of the insulating layer 2 in the inter-electrode block region 31 relative to a surface of the base substrate 1 is greater than a fourth height L4 of the third side S3 of the adjacent electrode of the plurality of electrode blocks 33 relative to the surface of the base substrate 1. Optionally, the first height L1 of the first side S1 of the insulating layer 2 in the inter-electrode block region 31 relative to a surface of the base substrate 1 is smaller than a fourth height L4 of the third side S3 of the adjacent electrode of the plurality of electrode blocks 33 relative to the surface of the base substrate 1. Optionally, the first height L1 of the first side S1 of the insulating layer 2 in the inter-electrode block region 31 relative to a surface of the base substrate 1 is substantially the same as a fourth height L4 of the third side S3 of the adjacent electrode of the plurality of electrode blocks 33 relative to the surface of the base substrate 1. Optionally, each of the plurality of electrode blocks 33 has a thickness in a range of approximately 0.1 μm to approximately 5 μm.

Figure 3:
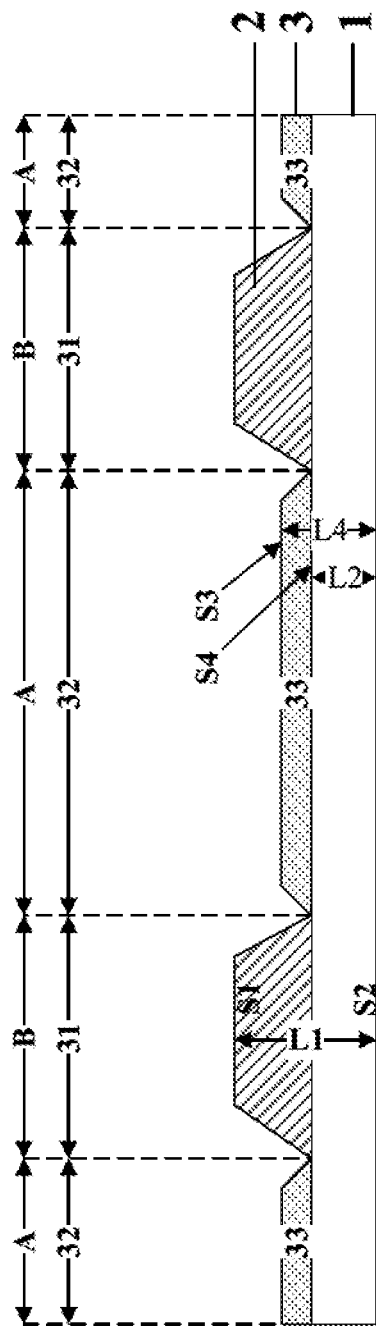
FIG. 3 is a schematic diagram illustrating the structure of a display substrate in some embodiments according to the present disclosure.

FIG. 3 is a schematic diagram illustrating the structure of a display substrate in some embodiments according to the present disclosure. As shown in FIG. 3, the insulating layer 2 in some embodiments is limited to the inter-electrode block region 31. Referring to FIG. 3, the display substrate in some embodiments includes a base substrate 1; an insulating layer 2 on the base substrate; and an electrode layer 3 on a side of the insulating layer 2 distal to the base substrate 1. The insulating layer 2 is limited to the inter-electrode block region 31, and has a first side S1 distal to the base substrate 1 and a second side S2 opposite to the first side S1 and proximal to the base substrate 1. As shown in FIG. 3, the first side S1 of the insulating layer 2 has a first height L1 relative to a surface of the base substrate 1 greater than a second height L2 of the fourth side S4 of an adjacent electrode of the plurality of electrode blocks 33 relative to the surface of the base substrate 1. Optionally, the first height L1 is greater than the second height L2 by approximately 1 μm to approximately 3 μm, e.g., by approximately 1.0 μm to approximately 1.5 μm, by approximately 1.5 μm to approximately 2.0 μm, by approximately 2.0 μm to approximately 2.5 μm, and by approximately 2.5 μm to approximately 3.0 μm.

Optionally, the first height L1 of the first side S1 of the insulating layer 2 in the inter-electrode block region 31 relative to a surface of the base substrate 1 is greater than a fourth height L4 of the third side S3 of the adjacent electrode of the plurality of electrode blocks 33 relative to the surface of the base substrate 1. Optionally, the first height L of the first side S1 of the insulating layer 2 in the inter-electrode block region 31 relative to a surface of the base substrate 1 is smaller than a fourth height L4 of the third side S3 of the adjacent electrode of the plurality of electrode blocks 33 relative to the surface of the base substrate 1. Optionally, the first height L1 of the first side S1 of the insulating layer 2 in the inter-electrode block region 31 relative to a surface of the base substrate 1 is substantially the same as a fourth height L4 of the third side S3 of the adjacent electrode of the plurality of electrode blocks 33 relative to the surface of the base substrate 1. Optionally, each of the plurality of electrode blocks 33 has a thickness in a range of approximately 0.1 μm to approximately 5 μm.

Optionally, the insulating layer 2 (either in the inter-electrode block region 31 or in the electrode block region 32) is a substantially transparent insulating layer.

In some embodiments, and as shown in FIG. 2, the insulating layer 2 in the inter-electrode block region 31 and the electrode block region 32 is an integral insulating layer extending substantially throughout the display substrate. Optionally, the first height L1 of the first side S1 of the integral insulating layer in the inter-electrode block region 31 relative to a surface of the base substrate 1 is greater than a fourth height L4 of the third side S3 of the adjacent electrode of the plurality of electrode blocks 33 relative to the surface of the base substrate 1; and the first side S of the integral insulating layer in the electrode block region 32 has a third height L3 relative to the surface of the base substrate 1 smaller than or substantially the same as the second height L2 of the fourth side S4 of the adjacent electrode of the plurality of electrode blocks 33 relative to the surface of the base substrate 1.

Figure 4:
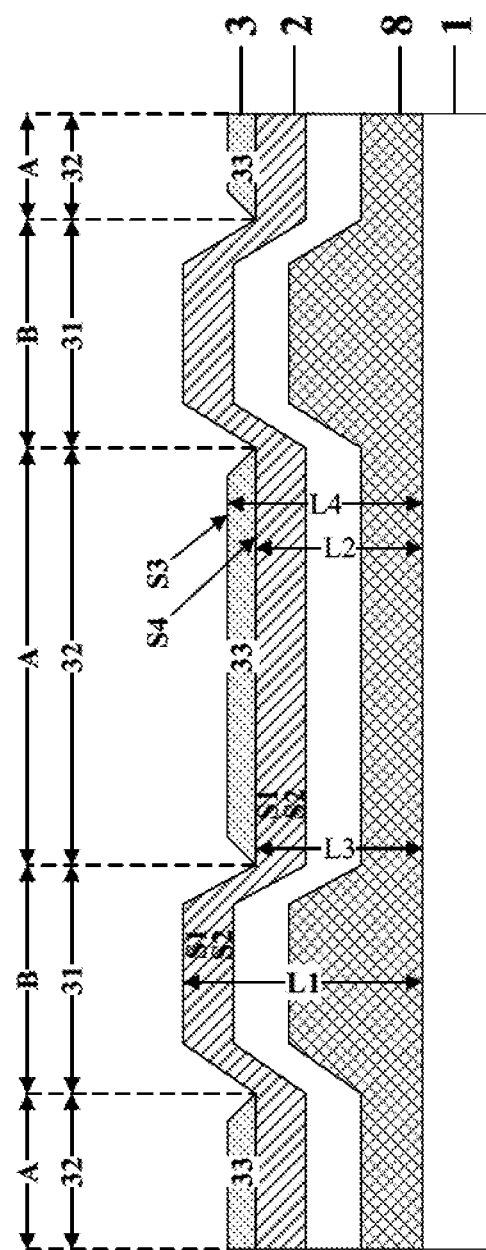
FIG. 4 is a schematic diagram illustrating the structure of a display substrate in some embodiments according to the present disclosure.

FIG. 4 is a schematic diagram illustrating the structure of a display substrate in some embodiments according to the present disclosure. Referring to FIG. 4, the display substrate in some embodiments includes a second insulating layer 8 on the base substrate, and the insulating layer 2 on a side of the second insulating layer 8 distal to the base substrate 1. Optionally, the insulating layer 2 is a layer having a substantially uniform thickness, and the insulating layer 2 is the layer in direct contact with the electrode layer 3, e.g., the insulating layer 2 and the electrode layer 3 are connected with each other without any intermediate connecting structure. Optionally, the second insulating layer 8 is a layer having a non-uniform thickness, e.g., thicker in some regions (e.g., in the inter-electrode block region 31) and thinner in some other regions (e.g., in the electrode block region 32). Optionally, the first side S1 of the insulating layer 2 in the inter-electrode block region 31 has a first height L relative to a surface of the base substrate 1 greater than a second height L2 of the fourth side S4 of an adjacent electrode of the plurality of electrode blocks 33 relative to the surface of the base substrate 1. Optionally, the first side S1 of the insulating layer 2 in the electrode block region 32 has a third height L3 relative to the surface of the base substrate 1 smaller than or substantially the same as the second height L2 of the fourth side S4 of the adjacent electrode of the plurality of electrode blocks 33 relative to the surface of the base substrate 1. Optionally, the first height L1 of the first side S1 of the insulating layer 2 in the inter-electrode block region 31 relative to a surface of the base substrate 1 is greater than a fourth height L4 of the third side S3 of the adjacent electrode of the plurality of electrode blocks 33 relative to the surface of the base substrate 1. Optionally, the insulating layer 2 is a passivation layer and the second insulating layer 8 is a gate insulating layer. Optionally, the first height L1 is greater than the second height L2 by approximately 1 μm to approximately 3 μm, e.g., by approximately 1.0 μm to approximately 1.5 μm, by approximately 1.5 μm to approximately 2.0 μm, by approximately 2.0 μm to approximately 2.5 μm, and by approximately 2.5 μm to approximately 3.0 μm.

Figure 5:
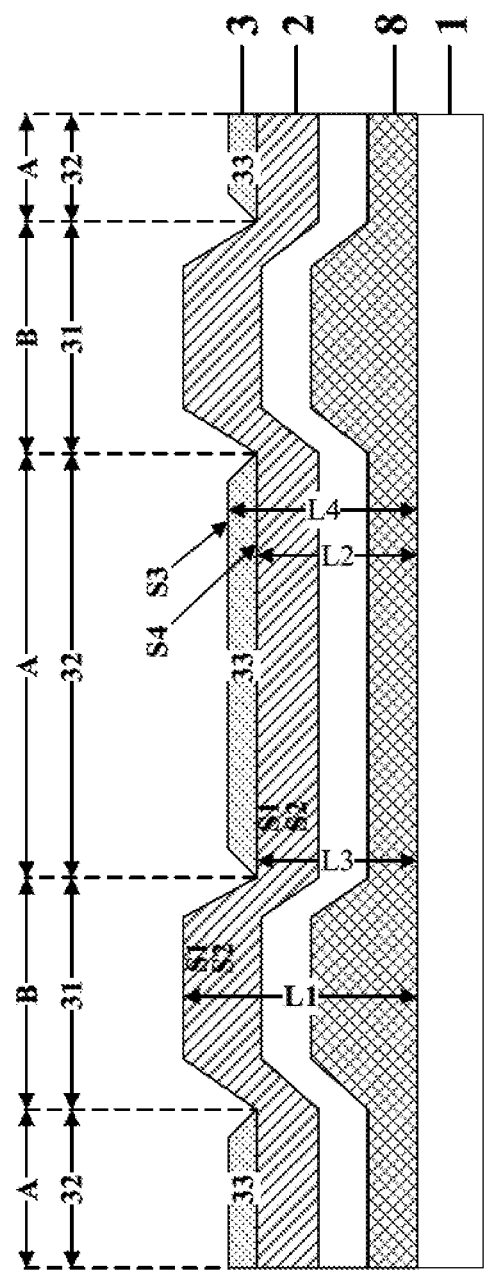
FIG. 5 is a schematic diagram illustrating the structure of a display substrate in some embodiments according to the present disclosure.

FIG. 5 is a schematic diagram illustrating the structure of a display substrate in some embodiments according to the present disclosure. Referring to FIG. 5, the display substrate in some embodiments includes an intermediate layer 8' on the base substrate, and the insulating layer 2 on a side of the intermediate layer 8' distal to the base substrate 1. Optionally, the insulating layer 2 is a layer in direct contact with the electrode layer 3, e.g., the insulating layer 2 and the electrode layer 3 are connected with each other without any intermediate connecting structure. Optionally, the insulating layer 2 is a layer having a non-uniform thickness, e.g., thicker in some regions (e.g., in the inter-electrode block region 31) and thinner in some other regions (e.g., in the electrode block region 32), and the intermediate layer 8' is also a layer having a non-uniform thickness, e.g., thicker in some regions (e.g., in the inter-electrode block region 31) and thinner in some other regions (e.g., in the electrode block region 32). Optionally, the first side S1 of the insulating layer 2 in the inter-electrode block region 31 has a first height L1 relative to a surface of the base substrate 1 greater than a second height L2 of the fourth side S4 of an adjacent electrode of the plurality of electrode blocks 33 relative to the surface of the base substrate 1. Optionally, the first side S1 of the insulating layer 2 in the electrode block region 32 has a third height L3 relative to the surface of the base substrate 1 smaller than or substantially the same as the second height L2 of the fourth side S4 of the adjacent electrode of the plurality of electrode blocks 33 relative to the surface of the base substrate 1. Optionally, the first height L1 of the first side S1 of the insulating layer 2 in the inter-electrode block region 31 relative to a surface of the base substrate 1 is greater than a fourth height L4 of the third side S3 of the adjacent electrode of the plurality of electrode blocks 33 relative to the surface of the base substrate 1. Optionally, the first height L1 is greater than the second height L2 by approximately 1 μm to approximately 3 μm, e.g., by approximately 1.0 μm to approximately 1.5 μm, by approximately 1.5 μm to approximately 2.0 μm, by approximately 2.0 μm to approximately 2.5 μm, and by approximately 2.5 μm to approximately 3.0 μm. Optionally, the insulating layer 2 is a passivation layer and the intermediate layer 8 is a gate insulating layer.

Figure 6:
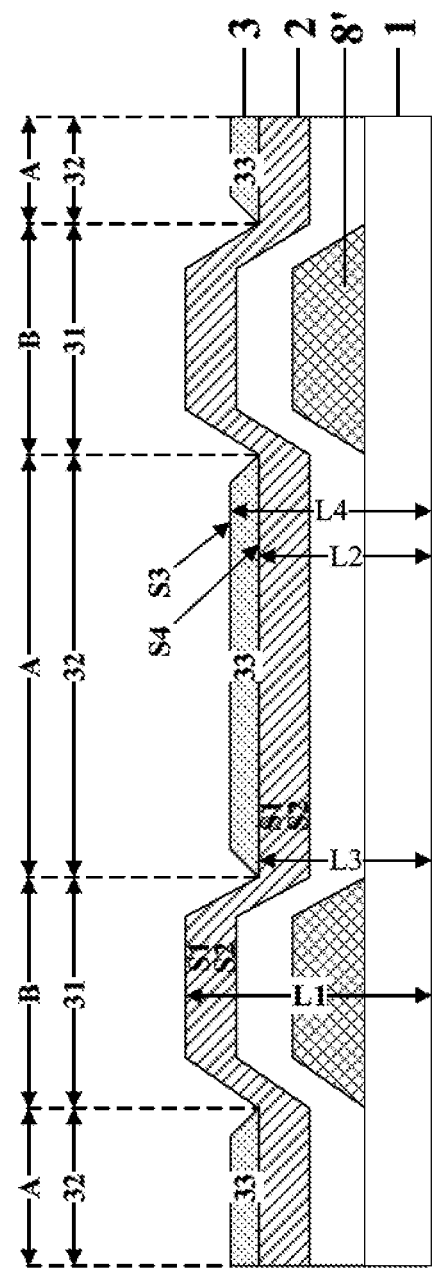
FIG. 6 is a schematic diagram illustrating the structure of a display substrate in some embodiments according to the present disclosure.

FIG. 6 is a schematic diagram illustrating the structure of a display substrate in some embodiments according to the present disclosure. Referring to FIG. 6, the display substrate in some embodiments includes an intermediate layer 8' on the base substrate, and the insulating layer 2 on a side of the intermediate layer 8' distal to the base substrate 1. Optionally, the insulating layer 2 is a layer having a substantially uniform thickness, and the insulating layer 2 is the layer in direct contact with the electrode layer 3, e.g., the insulating layer 2 and the electrode layer 3 are connected with each other without any intermediate connecting structure. Optionally, the intermediate layer 8' is limited to the inter-electrode block region 31. By having the intermediate layer 8' in the inter-electrode block region 31, optionally, the first side S1 of the insulating layer 2 in the inter-electrode block region 31 has a first height L1 relative to a surface of the base substrate 1 greater than a second height L2 of the fourth side S4 of an adjacent electrode of the plurality of electrode blocks 33 relative to the surface of the base substrate 1. Optionally, the first side S1 of the insulating layer 2 in the electrode block region 32 has a third height L3 relative to the surface of the base substrate 1 smaller than or substantially the same as the second height L2 of the fourth side S4 of the adjacent electrode of the plurality of electrode blocks 33 relative to the surface of the base substrate 1. Optionally, the first height L1 of the first side S1 of the insulating layer 2 in the inter-electrode block region 31 relative to a surface of the base substrate 1 is greater than a fourth height L4 of the third side S3 of the adjacent electrode of the plurality of electrode blocks 33 relative to the surface of the base substrate 1. Optionally, the first height L1 is greater than the second height L2 by approximately 1 μm to approximately 3 μm, e.g., by approximately 1.0 μm to approximately 1.5 μm, by approximately 1.5 μm to approximately 2.0 μm, by approximately 2.0 μm to approximately 2.5 μm, and by approximately 2.5 μm to approximately 3.0 μm. Optionally, the insulating layer 2 is a passivation layer and the intermediate layer 8 is a gate insulating layer.

The intermediate layer 8' in FIG. 6 may be any appropriate intermediate layer. Optionally, the intermediate layer 8' is an insulating layer. Optionally, the intermediate layer 8' is a semiconductor layer. Optionally, the intermediate layer 8' is a conductive layer such as an electrode layer.

In some embodiments, the intermediate layer 8' is a conductive layer such as an electrode layer. In one example, the display substrate is a liquid crystal display substrate, the plurality of electrode blocks 33 are a plurality of pixel electrodes for driving light emission in the plurality of subpixel areas, and the insulating layer 2 is a passivation layer. The intermediate layer 8' is a drain electrode of the display substrate. In another example, and referring to FIG. 6, the liquid crystal display substrate is an Advanced Super Dimension Switch-type display substrate, in which the pixel electrode includes a plurality of branches spaced apart by a plurality of slits. The electrode block region 32 corresponds to the plurality of branches, and the inter-electrode block region 31 corresponds to the plurality of slits. The drain electrode of the display substrate may be made to extend into the inter-electrode block region 31. By having the drain electrode extending into the inter-electrode block region 31, the insulating layer 2 is formed so that the first side S1 of the insulating layer 2 in the inter-electrode block region 31 has a first height L1 relative to a surface of the base substrate 1 greater than a second height L2 of the fourth side S4 of an adjacent electrode of the plurality of electrode blocks 33 (the plurality of branches of the pixel electrode) relative to the surface of the base substrate 1. The pixel electrode is formed by depositing a conductive material layer on the display substrate. When etching a portion of the conductive material layer (e.g., the portion corresponding to the plurality of slits of the pixel electrode corresponding to the inter-electrode block region 31) to form the pixel electrode, the etchant solution can readily permeate throughout the region, avoiding the issue of residues of the conductive material remaining after the etching process.

In some embodiments, and referring to FIGS. 2 to 6, the display substrate includes a plurality of subpixel areas in a plurality of subpixel regions A, and an inter-subpixel region B. For example, each of the plurality of electrode blocks is in one of the plurality of subpixel regions A. The electrode block region is a subpixel region A, and the inter-electrode block region is an inter-subpixel region B. As used herein, a subpixel region refers to a light emission region of a subpixel or subpixel area, such as a region corresponding to a pixel electrode in a liquid crystal display and a region corresponding to a light emissive layer in an organic light emitting diode display panel. Optionally, a pixel or a pixel area may include a number of separate light emission regions corresponding to a number of subpixels in the pixel or a number of subpixel areas in the pixel area. Optionally, the subpixel region is a light emission region of a red color subpixel or a red color subpixel area. Optionally, the subpixel region is a light emission region of a green color subpixel or a green color subpixel area. Optionally, the subpixel region is a light emission region of a blue color subpixel or a blue color subpixel area. Optionally, the subpixel region is a light emission region of a white color subpixel or a white color subpixel area. As used herein, an inter-subpixel region refers to a region between adjacent subpixel regions, such as a region corresponding to a black matrix in a liquid crystal display and a region corresponding a pixel definition layer in an organic light emitting diode display panel. Optionally, the inter-subpixel region is a region between adjacent subpixel regions in a same pixel or pixel area. Optionally, the inter-subpixel region is a region between two adjacent subpixel regions from two adjacent pixels or pixel areas. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

The electrode layer 3 can be any appropriate electrode structure in a display substrate. In some embodiments, the display substrate is a light emitting diode display substrate (e.g., an organic light emitting diode display substrate) having a plurality of light emitting diodes (e.g., a plurality of organic light emitting diodes). Each of the plurality of organic light emitting diodes includes a first electrode, a second electrode, and an organic light emitting layer between the first electrode and the second electrode. Optionally, the first electrode is an anode and the second electrode is a cathode. Optionally, the first electrode is a cathode and the second electrode is an anode. Optionally, the plurality of electrode blocks 33 are a plurality of anodes for driving light emission in the plurality of organic light emitting diodes. Optionally, the plurality of electrode blocks 33 are a plurality of cathodes for driving light emission in the plurality of organic light emitting diodes. Optionally, the insulating layer 2 is a planarization layer on a side of the electrode layer 3 proximal to the base substrate 1.

Figure 7:
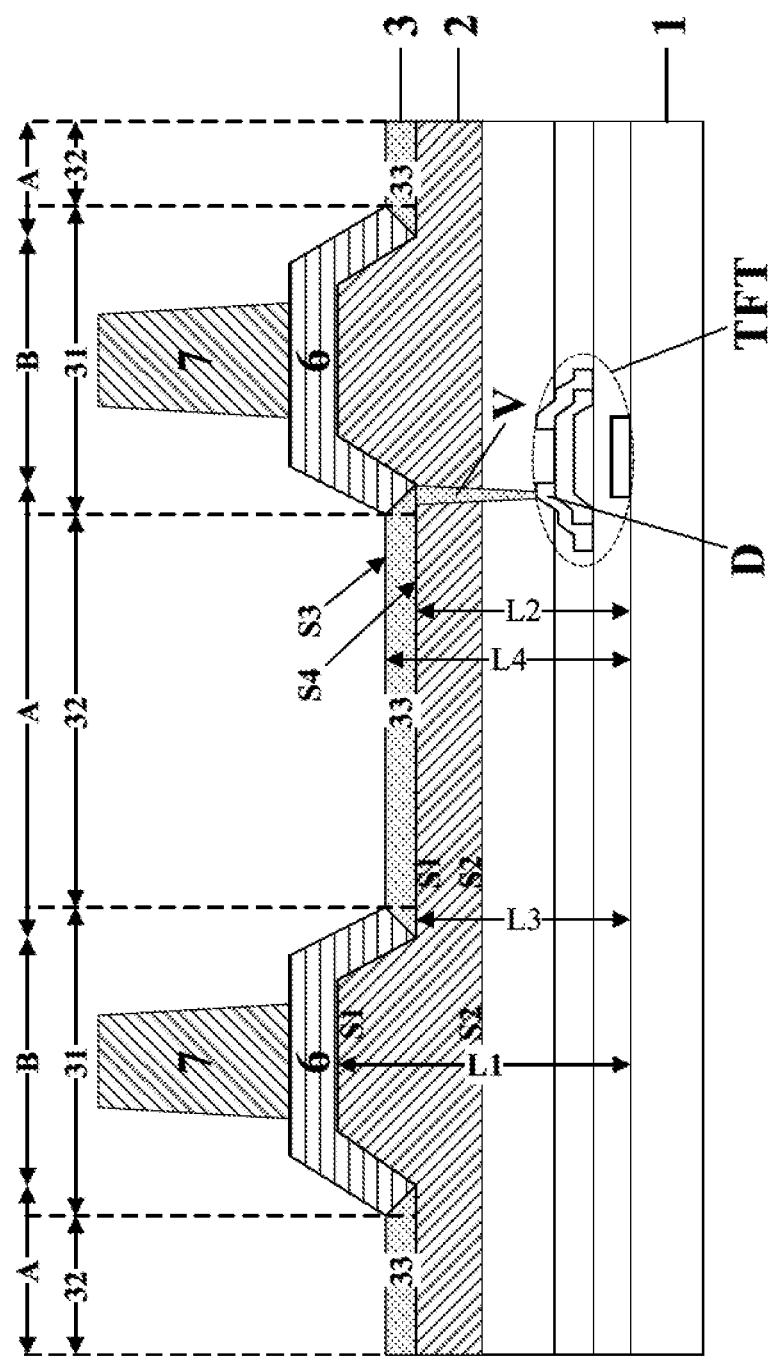
FIG. 7 is a schematic diagram illustrating the structure of a display substrate in some embodiments according to the present disclosure.

FIG. 7 is a schematic diagram illustrating the structure of a display substrate in some embodiments according to the present disclosure. Referring to FIG. 7, the display substrate in some embodiments is a light emitting diode display substrate (e.g., an organic light emitting diode display substrate), and the plurality of electrode blocks 33 are a plurality of anodes for driving light emission in the plurality of light emitting diodes (e.g., a plurality of organic light emitting diodes). As shown in FIG. 7, each of the plurality of electrode blocks 33 is electrically connected to a drain electrode D of a thin film transistor TFT through a via extending through the insulating layer 2. In some embodiments, the display substrate further includes a pixel definition layer 6 on a side of the planarization layer (e.g., the insulating layer 2 in FIG. 7) distal to the base substrate 1. Optionally, the display substrate further includes a spacer layer 7 on a side of the pixel definition layer 6 distal to the planarization layer (e.g., the insulating layer 2 in FIG. 7). The pixel definition layer 6 and the spacer layer 7 are in the inter-subpixel region B (e.g., the inter-electrode block region 31 in FIG. 7).

In some embodiments, the display substrate is a liquid crystal display substrate. Optionally, the plurality of electrode blocks 33 are a plurality of pixel electrodes for driving light emission in the plurality of subpixel areas. Optionally, the insulating layer 2 is a passivation layer. Optionally, each of the plurality of electrode blocks 33 (the plurality of pixel electrodes) is electrically connected to a drain electrode D of a thin film transistor TFT through a via extending through the insulating layer 2 (the passivation layer). In some embodiments, the display substrate further includes a spacer layer 7 on a side of the passivation layer distal to the base substrate 1.

In some embodiments, the display substrate is a liquid crystal display substrate. Optionally, the plurality of electrode blocks 33 are a plurality of common electrodes configured to be provided with a common voltage. Optionally, each of the plurality of electrode blocks 33 (the plurality of pixel electrodes) is electrically connected to a common electrode signal line through a via extending through the insulating layer 2 (the passivation layer). Optionally, the display substrate is a display substrate in an Advanced Super Dimension Switch-type display panel. Optionally, the common electrode signal line is in a same layer as the gate line and the gate electrode. Optionally, the insulating layer 2 is a passivation layer. Optionally, the insulating layer 2 is a gate insulating layer.

In some embodiments, the plurality of electrode blocks 33 are a plurality of gate electrodes. Optionally, the plurality of gate electrodes are a plurality of gate electrodes in a plurality of top-gate type thin film transistors, and the insulating layer 2 is a buffer layer in the display substrate. Optionally, the plurality of gate electrodes are a plurality of gate electrodes in a plurality of bottom-gate type thin film transistors, and the insulating layer 2 is a passivation layer in the display substrate.

In some embodiments, the plurality of electrode blocks 33 are a plurality of source electrodes and a plurality of drain electrodes. Optionally, the insulating layer 2 is a gate insulating layer in the display substrate.

Optionally, the display substrate is an array substrate. Optionally, the display substrate is a counter substrate such as a color filter substrate or an encapsulating substrate.

In another aspect, the present disclosure provides a method of fabricating a display substrate. In some embodiments, the method includes forming an insulating layer on a base substrate; and subsequent to forming the insulating layer, forming an electrode layer on a side of the insulating layer distal to the base substrate, the electrode layer formed to include a plurality of electrode blocks. Optionally, the display substrate is formed to have an electrode block region corresponding to the plurality of electrode blocks, and an inter-electrode block region outside the electrode block region. The insulating layer is formed to have a first side distal to the base substrate and a second side opposite to the first side and proximal to the base substrate. Each of the plurality of electrode blocks is formed to have a third side distal to the base substrate and a fourth side opposite to the third side and proximal to the base substrate. Optionally, the insulating layer and the electrode layer are formed so that the first side of the insulating layer in the inter-electrode block region has a first height relative to a surface of the base substrate greater than a second height of the fourth side of an adjacent electrode of the plurality of electrode blocks relative to the surface of the base substrate. Optionally, the insulating layer is a layer formed immediately adjacent to the electrode layer. Optionally, the method further includes forming additional layers between the electrode layer and the insulating layer. Optionally, the insulating layer and the electrode layer are formed so that the first side of the insulating layer in the electrode block region has a third height relative to the surface of the base substrate smaller than or substantially the same as the second height of the fourth side of the adjacent electrode of the plurality of electrode blocks relative to the surface of the base substrate. Optionally, the insulating layer and the electrode layer are formed so that the first height of the first side of the insulating layer in the inter-electrode block region relative to a surface of the base substrate is greater than a fourth height of the third side of the adjacent electrode of the plurality of electrode blocks relative to the surface of the base substrate. Optionally, the insulating layer in the inter-electrode block region and the electrode block region is formed as an integral insulating layer extending substantially throughout the display substrate. Optionally, the insulating layer is formed so that an orthographic projection of the insulating layer on the base substrate is substantially non-overlapping with orthographic projections of the plurality of electrode blocks on the base substrate. Optionally, the insulating layer and the electrode layer are formed so that the first side of the insulating layer in the electrode block region is in direct contact with the fourth side of the adjacent electrode of the plurality of electrode blocks. Optionally, the first height is greater than the second height by approximately 1 μm to approximately 3 μm. Optionally, the first height is greater than the third height by approximately 1 μm to approximately 3 μm.

Figure 8:
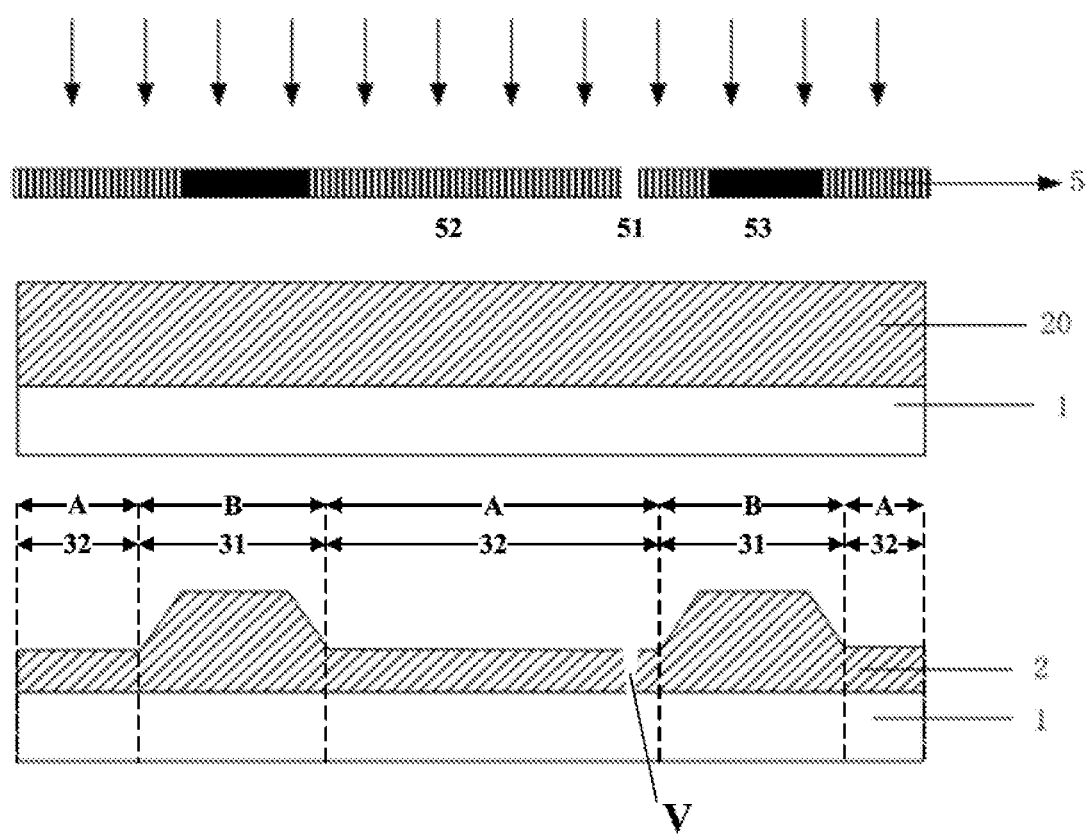
FIG. 8 illustrates a process of fabricating a display substrate in some embodiments according to the present disclosure.

FIG. 8 illustrates a process of fabricating a display substrate in some embodiments according to the present disclosure. Referring to FIG. 8, the step of forming the insulating layer in some embodiments includes forming an insulating material layer 20 on the base substrate 1; and patterning the insulating material layer 20 using a half-tone or gray-tone mask plate 5 thereby forming the insulating layer 2. Optionally, the insulating layer 2 is formed to have a first part in the inter-electrode block region 31 and a second part in the electrode block region 32. Optionally, the step of patterning the insulating material layer 20 further forms a plurality of vias V extending through the insulating layer. Optionally, the insulating layer 2 is a layer in direct contact with an electrode layer to subsequently formed in the display substrate, e.g., the insulating layer 2 and the subsequently-formed electrode layer are connected with each other without any intermediate connecting structure. Optionally, the display substrate further includes additional layers between the insulating layer 2 and the subsequently-formed electrode layer.

Figure 9:
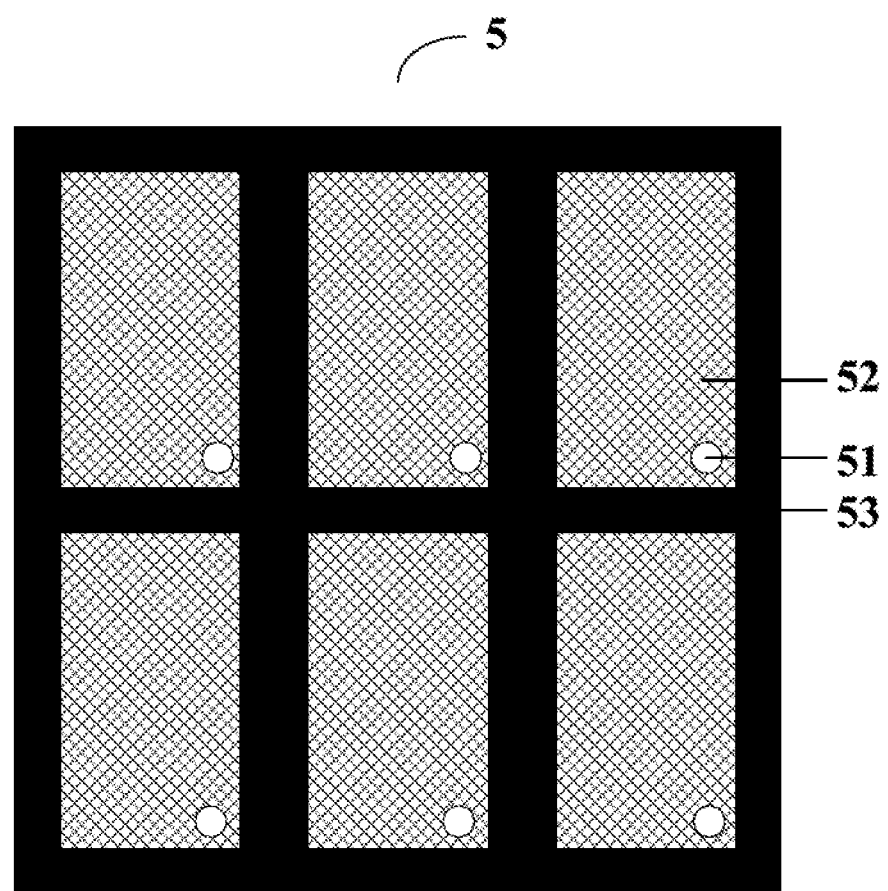
FIG. 9 is schematic diagram illustrating the structure of a mask plate for fabricating a display substrate in some embodiments according to the present disclosure.

FIG. 9 is schematic diagram illustrating the structure of a mask plate for fabricating a display substrate in some embodiments according to the present disclosure. Referring to FIG. 8 and FIG. 9, the mask plate in some embodiments includes a transmissive section 51, a semi-light-shielding section 52, and a light-shielding section 53. When a positive photoresist is used (e.g., as shown in FIG. 8 and FIG. 9), the transmissive section corresponds to the plurality of vias V, the semi-light-shielding section corresponds to the electrode block region 32, and the light-shielding section corresponds to the inter-electrode block region 31. When a negative photoresist is used, the light-shielding section corresponds to the plurality of vias V, the semi-light-shielding section corresponds to the electrode block region 32, and the transmissive section corresponds to the inter-electrode block region 31.

In some embodiments, the method includes depositing an insulating material on the base substrate 1 to form the insulating material layer 20; forming a photoresist layer on a side of the insulating material layer 20 distal to the base substrate 1; exposing the photoresist layer with a half-tone mask plate or a gray-tone mask plate, and developing the exposed photoresist layer to obtain a photoresist pattern having a first section corresponding to the plurality of vias V, a second section corresponding to the electrode block region 32, and a third section corresponding to the inter-electrode block region 31, the first section being fully exposed, the second section being partially exposed, the third section being substantially unexposed, and the photoresist material being removed in the first section; removing the semiconductor material layer and the amorphous carbon material layer in the first section, thereby forming the plurality of vias; removing the photoresist layer in the second section while maintaining the photoresist layer in the third section, thereby forming the insulating layer 2. Optionally, the photoresist layer in the second section is removed by ashing.

In some embodiments, the display substrate is formed to include a plurality of subpixel areas in a plurality of subpixel regions A. For example, each of the plurality of electrode blocks is formed in one of the plurality of subpixel regions A. The electrode block region 32 is a subpixel region A, and the inter-electrode block region 31 is an inter-subpixel region B.

In some embodiments, the display substrate to be formed is a light emitting diode display substrate (e.g., an organic light emitting diode display substrate) having a plurality of light emitting diodes (e.g., a plurality of organic light emitting diodes). Each of the plurality of organic light emitting diodes is formed to include a first electrode, a second electrode, and an organic light emitting layer between the first electrode and the second electrode. Optionally, the first electrode is an anode and the second electrode is a cathode. Optionally, the first electrode is a cathode and the second electrode is an anode. Optionally, the plurality of electrode blocks are a plurality of anodes for driving light emission in the plurality of organic light emitting diodes. Optionally, the plurality of electrode blocks are a plurality of cathodes for driving light emission in the plurality of organic light emitting diodes. Optionally, the insulating layer 2 is a planarization layer on a side of the electrode layer proximal to the base substrate 1.

Figure 10:
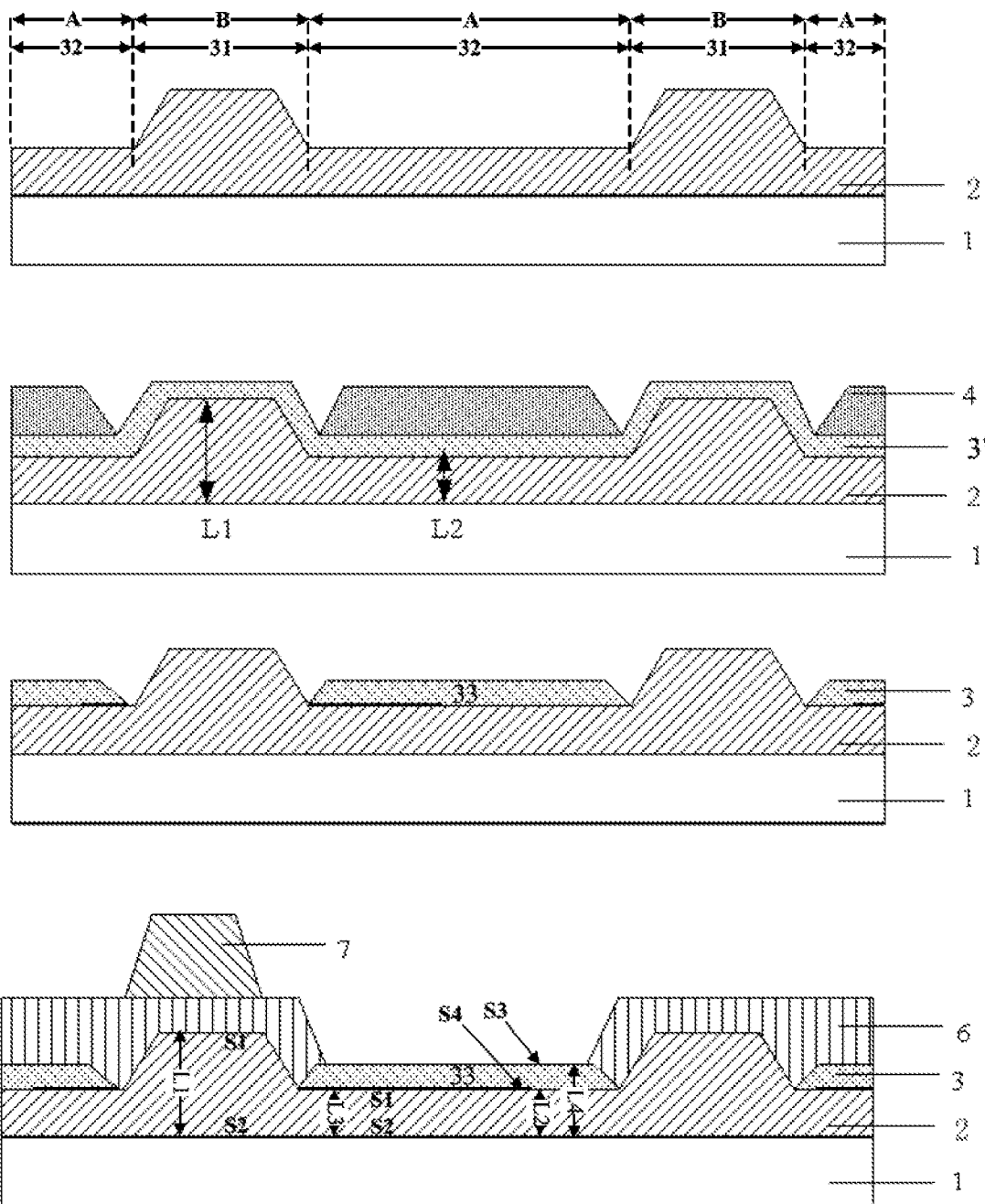
FIG. 10 illustrates a process of fabricating a display substrate in some embodiments according to the present disclosure.

FIG. 10 illustrates a process of fabricating a display substrate in some embodiments according to the present disclosure. Referring to FIG. 10, the display substrate in some embodiments is a light emitting diode display substrate (e.g., an organic light emitting diode display substrate), and the plurality of electrode blocks 33 are a plurality of anodes for driving light emission in the plurality of light emitting diodes (e.g., a plurality of organic light emitting diodes). As shown in FIG. 10, the method includes forming an insulating layer 2 (e.g., using a half-tone mask plate or a gray-tone mask plate) on a base substrate 1; forming an electrode material layer 3' on a side of the insulating layer 2; forming a photoresist layer 4 on a side of the electrode material layer 3' distal to the insulating layer 2; etching a portion of the electrode material layer 3' exposed by the photoresist layer 4 to form a plurality of electrode blocks 33; forming a pixel definition layer 6 on a side of the insulating layer 2 distal to the base substrate 1; and forming a spacer layer 7 on a side of the pixel definition layer 6 distal to the base substrate 1. The display substrate is formed to have an electrode block region 32 corresponding to the plurality of electrode blocks 33, and an inter-electrode block region 31 outside the electrode block region 32. The insulating layer 2 is formed to have a non-uniform thickness, e.g., thicker in some regions (e.g., in the inter-electrode block region 31) and thinner in some other regions (e.g., in the electrode block region 32). The insulating layer 2 is formed to have a first side S1 distal to the base substrate 1 and a second side S2 opposite to the first side S1 and proximal to the base substrate 1. Each of the plurality of electrode blocks 33 is formed to have a third side S3 distal to the base substrate 1 and a fourth side S4 opposite to the third side S3 and proximal to the base substrate 1. As shown in FIG. 10, in the inter-electrode block region 31, the first side S1 of the insulating layer 2 has a first height L1 relative to a surface of the base substrate 1 greater than a second height L2 of the fourth side S4 of an adjacent electrode of the plurality of electrode blocks 33 relative to the surface of the base substrate 1. In the electrode block region 32, the first side S1 of the insulating layer 2 has a third height L3 relative to the surface of the base substrate 1 smaller than or substantially the same as the second height L2 of the fourth side S4 of the adjacent electrode of the plurality of electrode blocks 33 relative to the surface of the base substrate 1. Optionally, the insulating layer 2 and the electrode layer 3 are formed so that the first height L1 of the first side S of the insulating layer 2 in the inter-electrode block region 31 relative to a surface of the base substrate 1 is greater than a fourth height L4 of the third side S3 of the adjacent electrode of the plurality of electrode blocks 33 relative to the surface of the base substrate 1. Optionally, the first height L1 is greater than the second height L2 by approximately 1 μm to approximately 3 μm, e.g., by approximately 1.0 μm to approximately 1.5 μm, by approximately 1.5 μm to approximately 2.0 μm, by approximately 2.0 μm to approximately 2.5 μm, and by approximately 2.5 μm to approximately 3.0 μm. Optionally, the first height L1 is greater than the third height L3 by approximately 1 μm to approximately 3 μm, e.g., by approximately 1.0 μm to approximately 1.5 μm, by approximately 1.5 μm to approximately 2.0 m, by approximately 2.0 μm to approximately 2.5 μm, and by approximately 2.5 μm to approximately 3.0 μm. Optionally, the insulating layer 2 and the electrode layer 3 are formed so that the first side S1 of the insulating layer 2 in the electrode block region 32 is in direct contact with the fourth side S4 of the adjacent electrode of the plurality of electrode blocks 33, e.g., the first side S1 of the insulating layer 2 in the electrode block region 32 is connected with the fourth side S4 of the adjacent electrode of the plurality of electrode blocks 33 with any intermediate structure.

Optionally, the pixel definition layer 6 and the spacer layer 7 are formed in the inter-subpixel region B (e.g., the inter-electrode block region 31 in FIG. 7).

Optionally, and referring to FIG. 10 and FIG. 7, the method in some embodiments further includes forming a plurality of vias V. Each of the plurality of electrode blocks 33 is formed to be electrically connected to a drain electrode D of a thin film transistor TFT through one of the plurality of vias V extending through the insulating layer 2.

In some embodiments, the display substrate is a liquid crystal display substrate. Optionally, the plurality of electrode blocks 33 are a plurality of pixel electrodes for driving light emission in the plurality of subpixel areas. Optionally, the insulating layer 2 is a passivation layer. Optionally, each of the plurality of electrode blocks 33 (the plurality of pixel electrodes) is formed to be electrically connected to a drain electrode D of a thin film transistor TFT through one of the plurality of vias V extending through the insulating layer 2 (the passivation layer). In some embodiments, the method further includes forming a spacer layer 7 on a side of the passivation layer distal to the base substrate 1.

In some embodiments, the display substrate is a liquid crystal display substrate. Optionally, the plurality of electrode blocks 33 are a plurality of common electrodes configured to be provided with a common voltage. Optionally, each of the plurality of electrode blocks 33 (the plurality of pixel electrodes) is formed to be electrically connected to a common electrode signal line through a via extending through the insulating layer 2 (the passivation layer). Optionally, the display substrate is a display substrate in an Advanced Super Dimension Switch-type display panel. Optionally, the common electrode signal line is formed in a same layer as the gate line and the gate electrode. Optionally, the insulating layer 2 is a passivation layer. Optionally, the insulating layer 2 is a gate insulating layer.

In some embodiments, the plurality of electrode blocks 33 are a plurality of gate electrodes. Optionally, the plurality of gate electrodes are a plurality of gate electrodes in a plurality of top-gate type thin film transistors, and the insulating layer 2 is a buffer layer in the display substrate. Optionally, the plurality of gate electrodes are a plurality of gate electrodes in a plurality of bottom-gate type thin film transistors, and the insulating layer 2 is a passivation layer in the display substrate.

In some embodiments, the plurality of electrode blocks 33 are a plurality of source electrodes and a plurality of drain electrodes. Optionally, the insulating layer 2 is a gate insulating layer in the display substrate.

In some embodiments, and referring to FIG. 6, the method in some embodiments further includes forming an intermediate layer 8' in the display substrate prior to the step of forming the insulating material layer. The intermediate layer 8' is formed so that the first side S1 of the insulating layer 2 in the inter-electrode block region 31 has a first height L1 relative to a surface of the base substrate 1 greater than a second height L2 of the fourth side S4 of an adjacent electrode of the plurality of electrode blocks 33 relative to the surface of the base substrate 1.

In one example, and referring to FIG. 6, the method is a method of fabricating an Advanced Super Dimension Switch-type display substrate, in which the pixel electrode includes a plurality of branches spaced apart by a plurality of slits. The electrode block region 32 corresponds to the plurality of branches, and the inter-electrode block region 31 corresponds to the plurality of slits. Optionally, the method includes forming a drain electrode (the intermediate layer 8') on the base substrate. The drain electrode is formed to extend into the inter-electrode block region 31. The method further includes forming an insulating layer 2 on a side of the drain electrode distal to the base substrate 1, and forming an electrode layer 3 on a side of the insulating layer 2 distal to the base substrate 1. Due to (at least in part) the formation of the drain electrode in the inter-electrode block region 31, the insulating layer 2 is formed so that the first side S1 of the insulating layer 2 in the inter-electrode block region 31 has a first height L1 relative to a surface of the base substrate 1 greater than a second height L2 of the fourth side S4 of an adjacent electrode of the plurality of electrode blocks 33 (the plurality of branches of the pixel electrode) relative to the surface of the base substrate 1. The pixel electrode (e.g., the electrode layer 3) is formed by depositing an electrode material layer on a side of the insulating layer 2 distal to the base substrate 1. When etching a portion of the conductive material layer (e.g., the portion corresponding to the plurality of slits of the pixel electrode corresponding to the inter-electrode block region 31) to form the pixel electrode, the etchant solution can readily permeate throughout the region, avoiding the issue of residues of the conductive material remaining after the etching process.

Optionally, the drain electrode in the inter-electrode block region 31 is made of a substantially transparent conductive material, e.g., a substantially transparent metal material.

Figure 11:
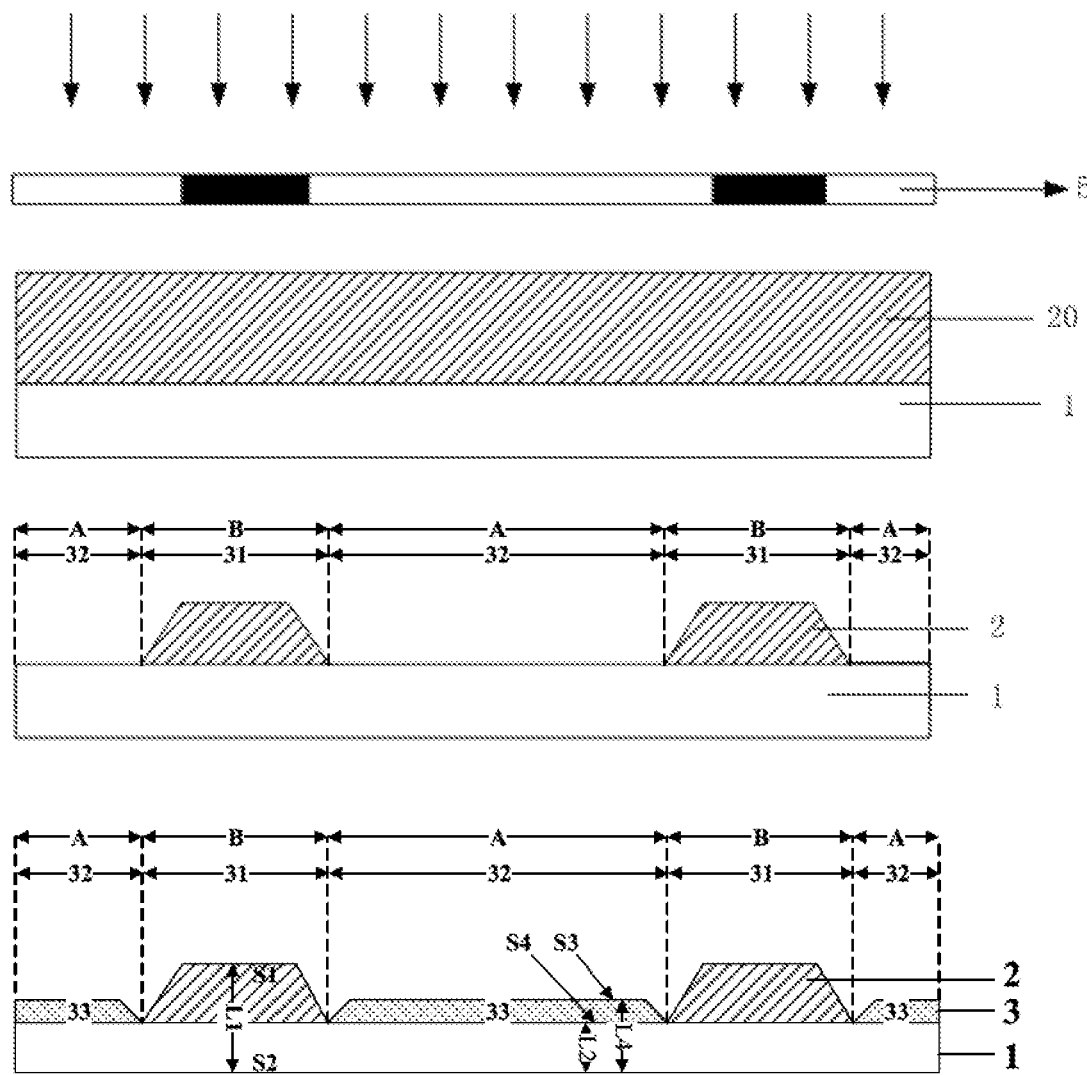
FIG. 11 illustrates a process of fabricating a display substrate in some embodiments according to the present disclosure.

FIG. 11 illustrates a process of fabricating a display substrate in some embodiments according to the present disclosure. Referring to FIG. 11, the method in some embodiments includes forming an insulating material layer 20 on the base substrate 1; patterning the insulating material layer 20 using a mask plate 5 to forming an insulating layer 2; and forming an electrode layer 3 including a plurality of electrode blocks on a side of the insulating layer 2 distal to the base substrate 1. The display substrate is formed to have an electrode block region 32 corresponding to the plurality of electrode blocks 33, and an inter-electrode block region 31 outside the electrode block region 32. The insulating layer 2 is formed to be limited to the inter-electrode block region 31. The insulating layer 2 is formed to have a first side S1 distal to the base substrate 1 and a second side S2 opposite to the first side S1 and proximal to the base substrate 1. Each of the plurality of electrode blocks 33 is formed to have a third side S3 distal to the base substrate 1 and a fourth side S4 opposite to the third side S3 and proximal to the base substrate 1. As shown in FIG. 11, in the inter-electrode block region 31, the first side S1 of the insulating layer 2 has a first height L1 relative to a surface of the base substrate 1 greater than a second height L2 of the fourth side S4 of an adjacent electrode of the plurality of electrode blocks 33 relative to the surface of the base substrate 1. Optionally, the insulating layer 2 and the electrode layer 3 are formed so that the first height L1 of the first side S1 of the insulating layer 2 in the inter-electrode block region 31 relative to a surface of the base substrate 1 is greater than a fourth height L4 of the third side S3 of the adjacent electrode of the plurality of electrode blocks 33 relative to the surface of the base substrate 1. Optionally, the first height L1 is greater than the second height L2 by approximately 1 μm to approximately 3 μm, e.g., by approximately 1.0 μm to approximately 1.5 μm, by approximately 1.5 μm to approximately 2.0 μm, by approximately 2.0 μm to approximately 2.5 μm, and by approximately 2.5 μm to approximately 3.0 μm.

In one example, the electrode layer 3 includes a plurality of gate electrodes. Optionally, the plurality of gate electrodes are a plurality of gate electrodes in bottom-gate type thin film transistors, and the insulating layer 2 is a buffer layer. Optionally, the plurality of gate electrodes are a plurality of gate electrodes in top-gate type thin film transistors, and the insulating layer 2 is a passivation layer. In another example, the electrode layer 3 includes a plurality of source electrodes and a plurality of drain electrodes, and the insulating layer 2 is a gate insulating layer.

In another aspect, the present disclosure provides a display apparatus having a display substrate described herein or fabricated by a method described herein. Optionally, the display substrate is an array substrate. Optionally, the display substrate is a counter substrate such as a color filter substrate or an encapsulating substrate. Optionally, the display apparatus is a liquid crystal display apparatus. Optionally, the display apparatus is an organic light emitting diode display apparatus. Optionally, the display apparatus is an electrophoretic display apparatus. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display substrate, comprising:
a base substrate;
an insulating layer on the base substrate; and
an electrode layer on a side of the insulating layer distal to the base substrate and comprising a plurality of electrode blocks;
wherein the display substrate has an electrode block region corresponding to the plurality of electrode blocks, and an inter-electrode block region outside the electrode block region;
the insulating layer has a first side distal to the base substrate and a second side opposite to the first side and proximal to the base substrate;
each of the plurality of electrode blocks has a third side distal to the base substrate and a fourth side opposite to the third side and proximal to the base substrate;
the first side of the insulating layer in the inter-electrode block region has a first height relative to a surface of the base substrate greater than a second height of the fourth side of an adjacent electrode of the plurality of electrode blocks relative to the surface of the base substrate;
the insulating layer comprises a protrusion in the inter-electrode block region;
the display substrate further comprises a pixel definition layer on a side of the protrusion distal to the base substrate, and limited in an inter-subpixel region;
the pixel definition layer is in direct contact with a top surface of the protrusion, in direct contact with the plurality of electrode blocks, and in direct contact with and covers an entirety of a lateral side surface of the protrusion;
a lowest point of the lateral side surface of the protrusion and a bottom surface of a respective electrode block of the plurality of electrode blocks have a same height relative to the surface of the base substrate; and
an orthographic projection of the pixel definition layer on the base substrate covers an orthographic projection of the protrusion on the base substrate.

2. The display substrate of claim 1, wherein the first side of the insulating layer in the electrode block region has a third height relative to the surface of the base substrate smaller than or substantially same as the second height of the fourth side of the adjacent electrode of the plurality of electrode blocks relative to the surface of the base substrate.

3. The display substrate of claim 1, wherein the insulating layer further comprises a recess in the electrode block region; and
orthographic projections of the plurality of electrode blocks on the base substrate are substantially non-overlapping with an orthographic projection of the protrusion.

4. The display substrate of claim 1, wherein the first side of the insulating layer in the electrode block region is in direct contact with the fourth side of the adjacent electrode of the plurality of electrode blocks.

5. The display substrate of claim 1, wherein the first height is greater than the second height by approximately 1 μm to approximately 3 μm.

6. The display substrate of claim 2, wherein the first height is greater than the third height by approximately 1 μm to approximately 3 μm.

7. The display substrate of claim 1, wherein the display substrate has a plurality of subpixel regions;
each of the plurality of electrode blocks is in one of the plurality of subpixel regions; and
the inter-electrode block region is the inter-subpixel region.

8. The display substrate of claim 1, wherein the display substrate is a light emitting diode display substrate comprising a plurality of light emitting diodes;
the plurality of electrode blocks are a plurality of anodes for driving light emission in the plurality of light emitting diodes; and
the insulating layer is a planarization layer.

9. The display substrate of claim 1, further comprising a spacer layer on a side of the protrusion distal to the insulating layer;
wherein the spacer layer is limited in the inter-subpixel region;
an orthographic projection of the pixel definition layer on the base substrate covers an orthographic projection of the spacer layer on the base substrate; and
an orthographic projection of the protrusion on the base substrate covers the orthographic projection of the spacer layer on the base substrate.

10. The display substrate of claim 1, wherein the display substrate is a liquid crystal display substrate;
the plurality of electrode blocks are a plurality of pixel electrodes for driving light emission in a plurality of subpixel regions; and
the insulating layer is a passivation layer.

11. The display substrate of claim 1, wherein the display substrate is a liquid crystal display substrate; and
the plurality of electrode blocks are a plurality of common electrodes.

12. The display substrate of claim 1, wherein the insulating layer in the inter-electrode block region and the electrode block region is an integral insulating layer extending substantially throughout the display substrate.

13. The display substrate of claim 1, wherein the first height of the first side of the insulating layer in the inter-electrode block region relative to a surface of the base substrate is greater than a fourth height of the third side of the adjacent electrode of the plurality of electrode blocks relative to the surface of the base substrate.

14. The display substrate of claim 1, wherein the insulating layer in the inter-electrode block region and the electrode block region is an integral insulating layer extending substantially throughout the display substrate;
the first height of the first side of the insulating layer in the inter-electrode block region relative to a surface of the base substrate is greater than a fourth height of the third side of the adjacent electrode of the plurality of electrode blocks relative to the surface of the base substrate; and the first side of the insulating layer in the electrode block region has a third height relative to the surface of the base substrate smaller than or substantially same as the second height of the fourth side of the adjacent electrode of the plurality of electrode blocks relative to the surface of the base substrate.

15. A display apparatus, comprising the display substrate of claim 1.

16. The display substrate of claim 1, wherein the insulating layer has a first thickness in a region having the protrusion and a second thickness in a region without the protrusion; and the first thickness is greater than the second thickness.

17. A method of fabricating a display substrate, comprising:

forming an insulating layer on a base substrate; and subsequent to forming the insulating layer, forming an electrode layer on a side of the insulating layer distal to the base substrate, the electrode layer formed to comprises a plurality of electrode blocks;

wherein the display substrate is formed to have an electrode block region corresponding to the plurality of electrode blocks, and an inter-electrode block region outside the electrode block region;

the insulating layer is formed to have a first side distal to the base substrate and a second side opposite to the first side and proximal to the base substrate;

each of the plurality of electrode blocks is formed to have a third side distal to the base substrate and a fourth side opposite to the third side and proximal to the base substrate;

the insulating layer and the electrode layer are formed so that the first side of the insulating layer in the inter-electrode block region has a first height relative to a surface of the base substrate greater than a second height of the fourth side of an adjacent electrode of the plurality of electrode blocks relative to the surface of the base substrate;

the insulating layer is formed to comprise a protrusion in the inter-electrode block region;

the method further comprises forming a pixel definition layer on a side of the protrusion distal to the base substrate, and limited in an inter-subpixel region;

the pixel definition layer is formed to be in direct contact with a top surface of the protrusion, in direct contact with the plurality of electrode blocks, and in direct contact with and covers an entirety of a lateral side surface of the protrusion;

a lowest point of the lateral side surface of the protrusion and a bottom surface of a respective electrode block of the plurality of electrode blocks have a same height relative to the surface of the base substrate; and an orthographic projection of the pixel definition layer on the base substrate covers an orthographic projection of the protrusion on the base substrate.

18. The method of claim 17, wherein the insulating layer and the electrode layer are formed so that the first side of the insulating layer in the electrode block region has a third height relative to the surface of the base substrate smaller than or substantially same as the second height of the fourth side of the adjacent electrode of the plurality of electrode blocks relative to the surface of the base substrate.

19. The method of claim 17, wherein the insulating layer is formed so that an orthographic projection of the insulating layer on the base substrate is substantially non-overlapping with orthographic projections of the plurality of electrode blocks on the base substrate.

20. The method of claim 18, wherein forming the insulating layer comprises:

forming an insulating material layer on the base substrate; and patterning the insulating material layer using a half-tone mask plate or a gray-tone mask plate thereby forming the insulating layer and a plurality of vias extending through the insulating layer;

wherein the insulating layer is formed to have a first part in the inter-electrode block region and a second part in the electrode block region.

* * * * *